United States Patent [19]

Bell

[11] Patent Number: 4,531,234
[45] Date of Patent: Jul. 23, 1985

[54] OPTIMIZING ANTENNA INTERFACE FOR AUTOMOBILE RADIO RECEIVERS

[75] Inventor: R. Richard Bell, Libertyville, Ill.

[73] Assignee: International Jensen Incorporated, Schiller Park, Ill.

[21] Appl. No.: 466,201

[22] Filed: Feb. 14, 1983

[51] Int. Cl.³ ............................................. H04B 1/18
[52] U.S. Cl. .................................. 455/247; 455/143; 455/235; 455/249; 455/250; 455/291
[58] Field of Search ............... 455/217, 234, 235, 241, 455/249–251, 280, 283, 291, 247, 142, 143

[56] References Cited

U.S. PATENT DOCUMENTS

| | | | |
|---|---|---|---|
| 1,905,946 | 4/1933 | Mathieu et al. | |
| 2,653,227 | 9/1953 | Önder | 455/143 |
| 3,022,420 | 2/1962 | Brinkerhoff | |
| 3,052,853 | 9/1962 | Smith | |
| 3,386,034 | 5/1968 | Entwistle | |
| 3,394,315 | 7/1968 | Gray | |
| 3,582,792 | 6/1971 | Conklin | 455/249 |
| 3,646,484 | 2/1972 | Maxwell et al. | 333/81 |
| 3,801,922 | 4/1974 | Muszkiewicz | |
| 3,918,003 | 11/1975 | Seidel | |
| 4,010,430 | 3/1977 | Wolfe | 333/81 |
| 4,047,131 | 9/1977 | Ludikhuize | 333/81 |
| 4,097,827 | 6/1978 | Williams | 333/81 |
| 4,138,637 | 2/1979 | Weinert | |
| 4,270,222 | 5/1981 | Menant | 455/236 |

OTHER PUBLICATIONS

Mielke et al., The Performance of FM Receivers in the Presence of Strong Signals, EBU Review, Technical Part, No. 181, 6/80, pp. 110–118.
VanWilligen, Automatic Input Attennator for H.F. Communication Receivers, The Radio and Electronic Engineer, vol. 47, No. 10, Oct. 1977, pp. 465–469.

Primary Examiner—Marc E. Bookbinder
Attorney, Agent, or Firm—Willian Brinks Olds Hofer Gilson & Lione Ltd.

[57] ABSTRACT

An automatic signal optimizing interface for connection between the antenna of an automobile radio receiver and the receiver itself processes the RF signal received by the antenna and provides an improved output signal to the automobile receiver which is optimized for distortion free reception. The output signal is limited to the desired frequency band to eliminate interfering signals, and is maintained within the optimum dynamic range of the receiver, even under reception conditions in which the received antenna signal itself is excessively high or undesirably low. The interface therefore permits superior performance by the radio receiver by optimizing the signal supplied to the radio and by preventing intermodulation distortion which otherwise commonly results from overloading of the front end of the radio receiver by excessively strong received signals.

The optimizing interface operates independent of the radio receiver, and therefore is amenable to after market or OEM use in conjunction with substantially all existing automobile radio receivers. Operation of the signal processing circuitry of the interface is automatic so that no user intervention or monitoring is required, and is sufficiently rapid and of sufficient range and resolution to compensate for nearly all adverse reception conditions encountered in both urban and rural areas.

8 Claims, 11 Drawing Figures

OPTIMIZING ANTENNA INTERFACE FOR AUTOMOBILE RADIO RECEIVERS

TECHNICAL FIELD

The present invention relates in general to signal processing and dynamic range expansion apparatus for mobile electromagnetic signal receivers, and in particular to an improved antenna to receiver interface providing signal processing and dynamic range expanding functions for use in conjunction with standard automobile FM receiver apparatus to maintain an optimum input signal to the receiver apparatus under a variety of adverse reception conditions.

BACKGROUND OF THE INVENTION

Advances in the field of solid state electronics have recently permitted spectacular improvements in the performance of consumer entertainment audio and video equipment. As a result, the consumer has appropriately come to expect ever higher levels of performance from mobile audio systems. Similarly, consumer tolerance for less than ideal performance is decreasing.

Although it has proved possible to increase the quality of mobile audio amplifiers, recorded media playback units, and output speakers, it has proved more difficult to overcome the difficulties inherent in mobile reception of RF signals, particularly frequency modulated signals, for various reasons. First, the advances in technology which have lead to the demand for improved reception have similarly resulted in a proliferation of RF signal sources. This includes not only numerous additional television and FM commercial stations, but also vastly increased use of the electromagnetic spectrum both above and below, for example, the FM broadcast range (88-108 MHz). As discussed in detail below, this has resulted in a crowding of the broadcast spectrum, particularly in metropolitan areas.

Second, because of inherent propagation restrictions, commercial television and FM broadcasts are somewhat limited in their ideal reception range. However, consumer intolerance for low quality reception, coupled with the long distance mobility of drivers, has lead to a demand for increased sensitivity in, for example, FM receivers to maximize the usable reception range. This is particularly true in regions where desired stations are few in number and spaced relatively large distances apart, such as in the central and southwest regions of the United States.

In order to provide increased sensitivity and improved reception of distant or weak signals, modern automobile FM receivers, for example, typically include an initial RF amplification stage connected to the automobile antenna to boost the signal prior to detection. In this manner, signals that would otherwise fall below the detection threshold are amplified sufficiently to be detected. Unlike the IF amplifier, however, this first stage must process the entire desired spectrum of FM frequencies, since the amplification occurs prior to mixing. Common base amplifier configurations are typically used to provide gain at the RF frequencies.

In a related fashion, external preamplifiers are known, and are used to similarly amplify the broadcast antenna signal. Switches are often provided so that the user may activate or deactivate such amplification as desired.

Difficulties arise when such systems are operated within the crowded and high energy spectrum present in metropolitan areas. Specifically for example, the front end RF amplifiers in FM receivers are limited in dynamic range. Signals which exceed this range saturate the amplifier and are "clipped." Although such clipping is desirable in the IF stage, which is limited to the single desired signal, it can lead to severe intermodulation distortion when multiple signals are present, as in the broadband amplifier. The resulting intermodulated signals may appear at beat frequencies within the audio range, and may cause "phantom" reception of undesired signals, obliterating weaker desired signals. In general, the overloading results in a loss of the desired signal and a highly objectionable high frequency audio distortion.

Clear reception of FM signals in powerful urban settings is further complicated by the rapid and large variations in overall broadcast signal strength that are encountered. For example, at certain locations the antenna may be subjected to very high signal strengths from many RF transmitters, as well as to reflected signal energy. In contrast, other areas lie largely within electromagnetic shadows, and the overall signal strength presented to the antenna may be quite low. In fact, it has been found that for commercial FM broadcasts, fluctuation of as much as 90 dB may exist between nearby locations. Further, a moving car may be exposed to rapid fluctuations of this magnitude. In fact, changes on the order of 60 db may occur within milliseconds as the car is operated normally in a city.

In order to reduce the intermodulation distortion cause by front end overloading, the broadband RF amplifier may be made less prone to saturation. However, this typically reduces the sensitivity, compromising fringe area reception. Automatic gain control circuits are also employed to adjust the gain of the IF amplifier and/or RF amplifier in response to the signal levels within the IF stage. However, such AGC circuitry must be integral to the specific receiver design, and will not prevent intermodulation distortion resulting from the effect of multiple signals exceeding the limited dynamic range of the front end of the receiver.

Finally, certain commercially available automobile receivers incorporate fixed attenuators which are switch-selectible by the user. Commonly denominated as "local/distant" adjustment, the user selectible attenuator provides a predetermined attenuation of the input RF to minimize overloading. However, because of the very wide variations that are present, it is impossible to optimize the receiver to all conditions in this manner, for a preselected attenuation which is sufficiently low to provide the sensitivity required in relatively quiet areas of a city will be insufficient to prevent intermodulation distortion in the high signal areas.

A further drawback of existing systems is the requirement for user intervention. Present systems require that the user first observe the degraded performance of the receiver, then determine its probable cause and possible solution, and finally take the affirmative steps required to engage the appropriate corrective equipment. The driver is thus distracted from the driving function, and is necessarily subjected to temporarily degraded performance in the receiver equipment. Further, it is not possible to provide manual adjustment responsive to the very rapid fluctuations in signal strength present in urban settings.

In view of the foregoing, it becomes an object of the present invention to provide an interface for insertion between an antenna or other source of broadband RF signals and the associated RF receiver for processing the received RF signal to maintain an output signal that is within the optimum input dynamic range of the receiver regardless of the character of the input signal. A related object is to provide signal processing in an automated fashion that does not require user intervention.

A particular object is to provide such an automated signal processing interface for use in connection with mobile receivers, such as automotive FM radio or television receivers.

In this regard, a further object is to provide automatically variable attenuation of undesirably strong received signals so that the resulting output signal is optimally matched to the input requirement of, for example, a standard automobile FM radio, where said automatically variable attenuation is of sufficient range and resolution to maintain the resulting output signal within the desired input range of the automobile radio for substantially all levels of strong input signals.

Another object is to provide sufficiently rapid response of the variable attenuator to compensate for rapid signal strength fluctuations. It is also an object of the present invention to provide for the desirable attenuation in a fashion that prevents "gaps" or intermittent occasions of intermodulation distortion between various attenuator levels, and without introducing additional sources of potential distortion.

On the other hand, it is still a further object of the present invention to also provide for processing of undesirably weak signals when appropriate to improve the sensitivity of the resulting radio system. A related object is to provide for such amplification in an automated fashion that does not require user intervention, and does not interfere with or compromise the aforedescribed objects.

Another object of the present invention is to provide a system that renders the automobile FM receiver, for example, immune from the effects of extraneous signals outside of the desired FM broadcast band. A related object is to make the aforementioned signal processing interface apparatus substantially immune from extraneous operation as a result of signals outside of, for example, the desired FM band.

Another object is to provide an optimizing system as described that permits the user to defeat all or some of the improvement features in order to observe their effect and benefit by comparison to an unprocessed antenna signal.

An important object of the present invention is to provide for such an improved optimization system in a manner which can be utilized in conjunction with existing automotive or other mobile receiver apparatus, such as standard FM radio receivers or tuners, without modification. A related object is to provide such a system for after-market, add-on installation to existing systems, such that the unit operates independently of the particular radio receiver employed. Yet another object is to provide such an optimizing signal processing interface for FM signals, without degrading the performance of the AM receiver in standard AM/FM mobile radios.

A further object is to provide for such an improved optimization system at a minimum of cost and in a fashion amenable to ease of installation and operation by the untrained user.

These and other advantages, objects, and features of the present invention will become apparent in light of the present specification and accompanying drawings.

BRIEF SUMMARY OF THE INVENTION

In order to achieve the aforementioned objects and to overcome the shortcomings and problems associated with the prior art, the present invention provides a signal processing interface for connection between an automobile antenna and the antenna signal input of the mobile receiver, such as a standard automobile FM receiver. The device is self-contained and sufficient, so as to be substantially independent of the standard receiver whose performance is optimized. In this manner, the apparatus may be utilized in connection with substantially all existing automotive broadcast radio equipment, either as OEM or as an after-market product.

The interface is designed to provide required processing of the input signal to optimize the resulting output signal. The input signal comprises a broadband RF signal received from, for example, a standard automobile antenna system. This unprocessed input signal includes not only the signals of interest within the desired frequency band, but also additional RF signals both above and below the desired band. The dynamic range of this signal may extend well above and also below the optimum input dynamic range of the automobile receiver.

Filters are provided to suppress these undesired signals above and/or below the reception band of the standard receiver. In addition, the present invention provides for automatic amplification of weak signals when desirable to improve fringe area reception by the receiver. The interface further provides for automatic attenuation of the input signal in the desired band when desirable, in order to maintain the output signal within the optimum dynamic range for reception by the receiver.

The selection of attenuation and/or amplification is under the control of a control means responsive to the overall signal strength of the entire desired frequency band. Adjustments in gain are made rapidly and automatically as necessary.

It is seen, therefore, that the present invention provides an interface that automatically compensates for undesirable signal conditions, and supplies the standard receiver with an optimum input signal, regardless of the non-ideal character of the actual signal as received by the antenna. In this manner, the receiver itself is substantially isolated from the non-ideal RF environment, and receives instead a near-ideal RF input comprising only the desired reception band frequency signals, which are maintained within the dynamic range of the receiver for distortion free tuning and detection. The user therefore may enjoy enhanced performance of the receiver apparatus, in a user-transparent manner requiring no manual intervention or control.

DETAILED DESCRIPTION OF PREFERRED EMBODIMENT

The remaining portion of this specification will describe preferred embodiments of the invention when read in conjunction with the attached drawings.

Figure 1:
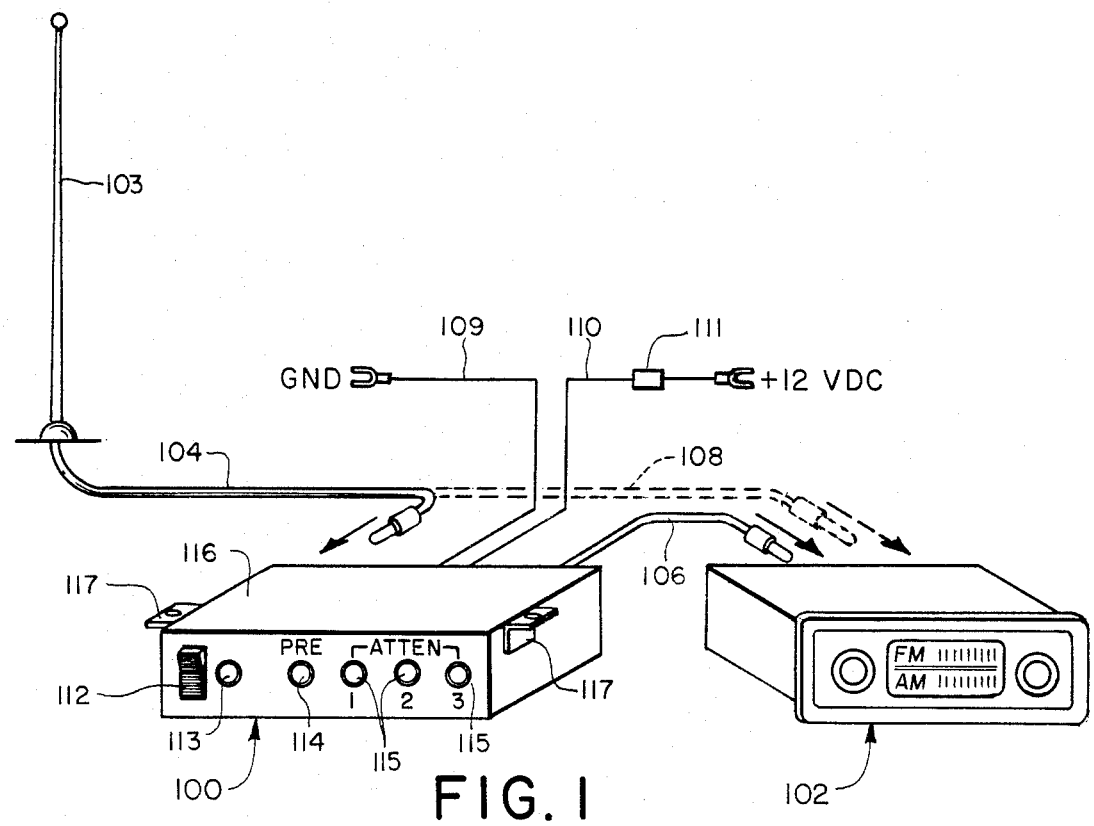
FIG. 1 llustrates a front elevational view of a representative embodiment of the present invention, illustrating its incorporation as an interface in a standard automobile radio system.

FIG. 1 illustrates a representative improved automobile radio system incorporating interface 100.

Interface 100 is shown enclosed within protective case 116, which is designed to be mounted in a car in a manner known in the art, such as by use of mounting means 117. In the embodiment illustrated, interface 100 further includes status indicators for informing the user of its instantaneous mode of operation. Specifically, preamplifier indicator 114 is illuminated when and only when the preamplification stage is active. Similarly, attenuator indicators 115 provide visual indication of the status of the associated attenuation stages.

Switch 112 may be provided in one embodiment to provide selectible insertion or removal of the active interface circuitry from the radio system, so that the user may compare the radio outputs corresponding to the processed and unprocessed inputs. On/off indicator 113 may correspondingly be provided.

In a typical automobile installation, interface 100 is interposed between antenna 103 and the automobile receiver apparatus 102. This may be accomplished by removing antenna lead 104 from the antenna input of receiver apparatus 102 as shown in phantom at 108, and attaching it to the input of interface 100. The output to the interface is then supplied by means of output conductor 106 to the input of receiver apparatus 102.

Interface 100 may be connected to the automobile electrical system in a manner known in the art. Specifically, ground lead 109 may be attached to any suitable ground point, while power lead 110 is attached to a source of appropriate voltage. In a preferred embodiment, power lead 110 may be connected to the switched ignition auxiliary power supply of the vehicle, so that interface 100 is electrically inactive when the automobile is not running.

Finally, in-line fuse 111 may be incorporated with power lead 10 in order to provide convenient user access to the protective fuse.

From the foregoing, it is apparent that interface 100 may be easily adapted for use in connection with any standard automotive system. It is understood that alternative embodiments are possible. For example, switch 112 and/or indicators 113, 114, and 115 may be deleted. Further, alternative protective cases 116 may be utilized, including those designed for hidden mounting within or beneath the dash area. Incorporation within the protective case of the receiver apparatus itself is also possible.

Figure 2:
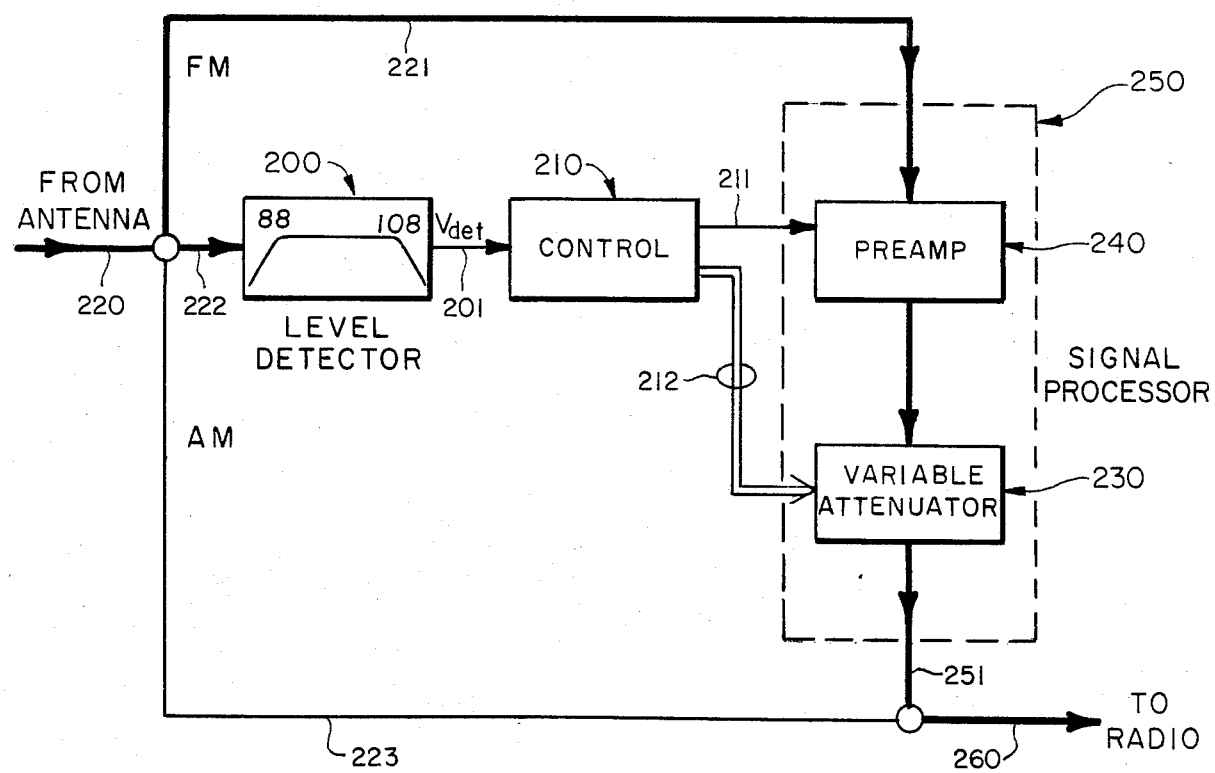
FIG. 2 is a basic functional block diagram of one embodiment of the present invention.

FIG. 2 is a block diagram illustrating the basic operation of a preferred embodiment of the present invention for use in connection with standard mobile AM/FM radio receivers.

In operation, the broadband signal 220 derived from the radio antenna is applied to the interface. A first portion 221 of the FM signal is applied to controlled signal processor 250. Signal processor 250 provides appropriate levels of amplification or attenuation to signal 221, so that processed output signal 260 is optimized to remain within the nominal input dynamic range of standard FM receivers.

The appropriate type and magnitude of processing applied by signal processor 250 is determined by control means 210. Specifically, a second portion 222 of the received FM signal is applied to level detector 200, which generates a control voltage 201 representative of the overall signal strength of the desired received signal. Responsive to the instantaneous level of control voltage 201, control means 210 generates appropriate control signals 211,212. Specifically, preamplifier control signal 211 is supplied to the controllable preamplifier 240 of signal processor 250, such that preamplification is supplied to signal 221 when control signal 211 is at a first level, and is removed when control signal 211 is at a second level. Similarly, attenuator control signals 212 are supplied to controllable variable attenuator 230 of signal processor 250 to determine the level of resulting attenuation.

Finally, an output signal 260 comprising the processed FM signal 251 previously described, as well as AM signal 223 derived from the broadband signal 220, is supplied to the automobile radio receiver. This enables the present invention to be used as previously described to provide optimizing signal processing of FM signals for AM/FM mobile radios, without preventing operation of the AM receiver section as well.

Figure 3:
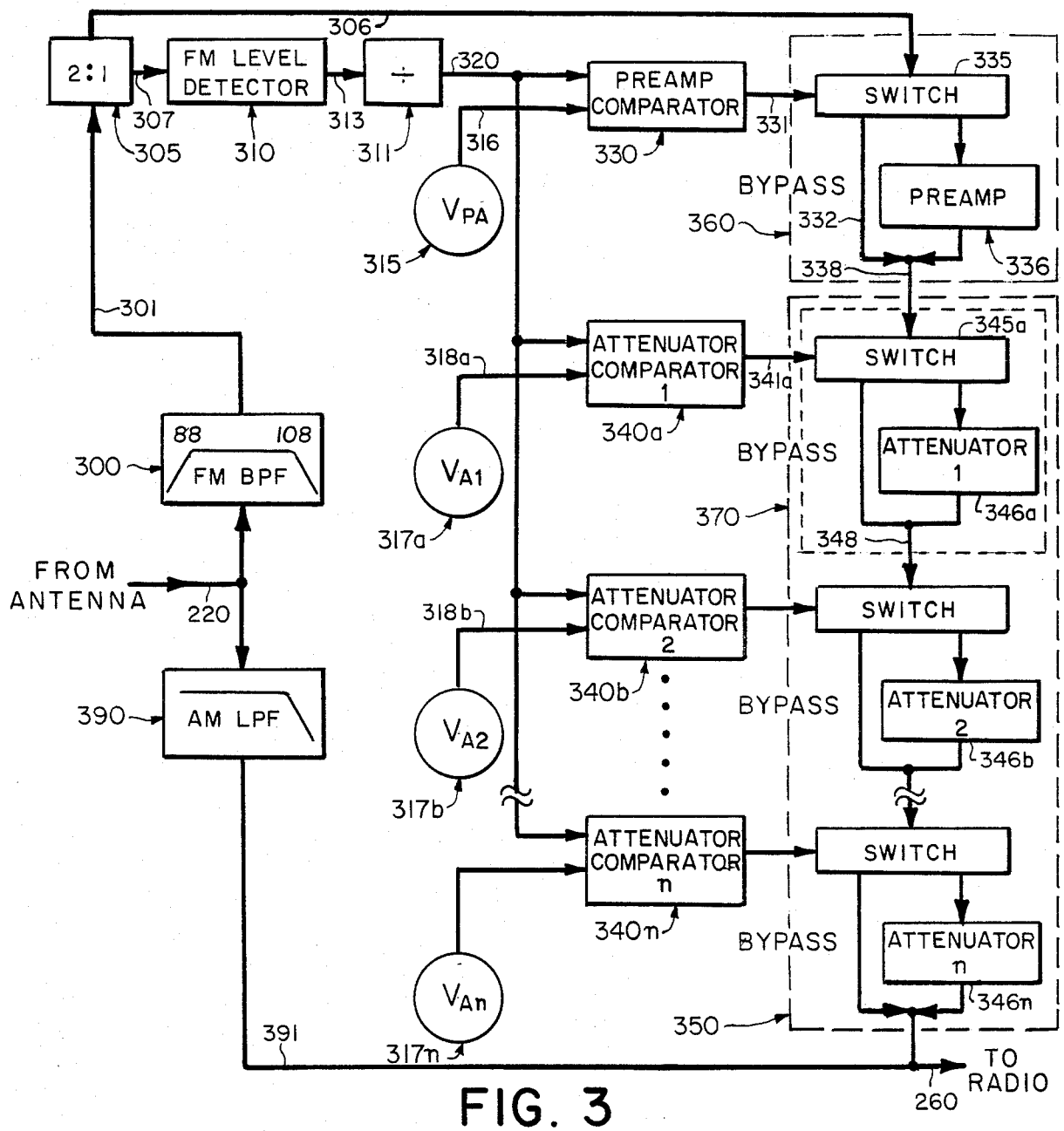
FIG. 3 is a circuit block diagram of a preferred embodiment of the present invention.

FIG. 3 is a block diagram illustrating the configuration of a preferred embodiment for use in association with a standard automobile AM/FM radio receiver, for example. Antenna signal 220 is first applied to FM bandpass filter 300, which is designed to selectively pass only those signals within the FM spectrum, blocking all other possibly interfering signals. The resulting FM signal 301 is next divided by splitter 305 into a first FM signal 306 for processing and passage to the automobile radio, and a second sample signal 307 for use in controlling the signal processor itself.

A preferred embodiment of the signal processing section is shown comprising a multiplicity of individual stages connected in series interconnection. However, alternative parallel, or combination series/parallel configurations, are possible.

In the series configuration shown, signal 306 is first applied to processing element 360 for selective preamplification. Element 360 therefore includes preamplifier 336 to provide the desired gain. Selection of amplification or nonamplification by the preamplifier as shown is accomplished by switch 335, which selectively passes signal 306 to preamplifier 336 or to bypass 332, under the control of control signal 331, whose operation is discussed more fully below.

First stage output signal 338, which, as described, consists of either an amplified signal or of a bypassed and unprocessed signal, is next applied to the variable attenuator 350. Variable attenuator 350 is shown in a preferred embodiment comprising a multiplicity of series interconnected individual attenuator stages, exemplified by processor element 370.

Attenuator processor element 370 operates in a manner analogous to that of preamplifier element 360. Specifically, input signal 338 is applied to switch 345a, which selectively routes the input signal through first signal attenuator 346a or, alternatively, through bypass 342a. The resulting signal 348 is then passed to the next signal processing element.

A multiplicity of attenuating processing elements similar to element 370 are provided, which include a multiplicity of attenuators 346x. Because of the series connection of the preferred embodiment previously described, the total attenuation available is equal to the sum of the gains of the individual attenuators. Further, individual intermediate levels are attainable which are equal to any combinatorial sum of the individual attenuator gains.

By appropriate manipulation of the electrical or electronic switches 335 and 345x, a signal processing stage results which may in one instance pass the input signal 306 through in a substantially unaltered form to supply the automobile radio directly with the FM bandpass limited signal, while in other instances may further process the input signal to optimize it for use by the radio receiver. This processing may include amplification of weak signals, or may include attenuation of undesirably strong signals.

In the preferred embodiment shown, a single selectible preamplifier is incorporated, although a selectible multiplicity of individual stages of amplification, or variable amplification, are also possible. The preferred embodiment of the variable attenuator comprises three individual fixed attenuators which are selectively combined in additive fashion to provide a multiplicity of attenuation steps as desired. It should be noted that a greater or fewer number of individual attenuators, or other types of variable attenuators, may similarly be used.

In order to provide the desired automatic operation, an automatic control circuit is provided. Specifically, in the preferred embodiment illustrated in FIG. 3, a second portion 307 of the FM band limited signal 301 is supplied to an FM level detector 310, which is independent of the automobile radio itself. A rectified output signal 313, whose instantaneous voltage is substantially proportional to the total overall signal strength of all radio signals present in the FM band, is utilized to provide control intelligence to the individual processor element control stages previously discussed. A voltage divider 311 may optionally be included as shown to provide for sensitivity matching of the automatic control to standard radio receivers exhibiting greater or lesser degrees of input sensitivity, resulting in an optimized control voltage 320.

Control of the individual processing element is, in the preferred embodiment shown, accomplished by means of associated comparator circuits. For example, preamplifier comparator 330 is used to compare the control voltage 320 to a preselected preamplifier threshold voltage 316, which is in turn supplied by preamplifier threshold voltage network 315. The level of threshold voltage 316 is selected to be substantially equal to the level of control voltage 320 that corresponds to the signal strength of FM band limited signal 306 at which insertion or removal of preamplification is optimally desired. For signal levels less than this threshold, control voltage 320 will be less than (or greater than) threshold voltage 316, causing preamplifier comparator 330 to generate a first level of control output 331 activating switch 335 to insert preamplifier 336. Similarly, when the signal strength of FM signal 306 rises above this optimal level such that preamplification is no longer desired, control voltage 320 will be greater than (or less than) threshold voltage 316, causing comparator 330 to output a second control signal 331 activating switch 335 to remove the preamplifier 336 and to insert instead bypass 332.

Operation of the control circuitry associated with the individual attenuator stages is similar to that previously described in connection with the preamplifier. In a preferred embodiment, an individual attenuator comparator 340x is provided for each attenuator stage, as well as individually selected threshold voltages 318x supplied by control voltage generators 317x. The levels of these threshold voltages 318x are selected to progressively insert individual attenuators as the signal strength of FM signal 306 increases, in order to maintain output signal 260 within the desired optimum dynamic range.

Finally, because typical automobile radios include AM reception circuitry as well as FM receivers, it is desired to provide the AM information to output signal 260. In a preferred embodiment as shown, broadband input signal 220 is provided to an AM lowpass filter 390. The resulting signal 391 contains the desired AM signal, but none of the higher frequency FM signals. In this manner, undesirable interference by direct passage of possibly high level FM signals is prevented, as well as undesirable feedback of the processed FM signal to the circuitry previously described. As a result, use of AM/FM selector switch is avoided, in keeping with the desired automatic function of the present interface.

Figure 4A:
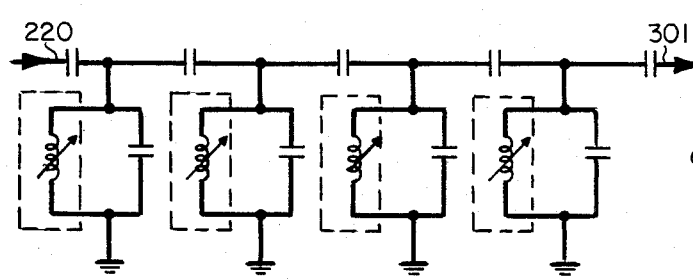
FIG. 4A is a circuit diagram for one embodiment of the FM bandpass filter.
Figure 4B:
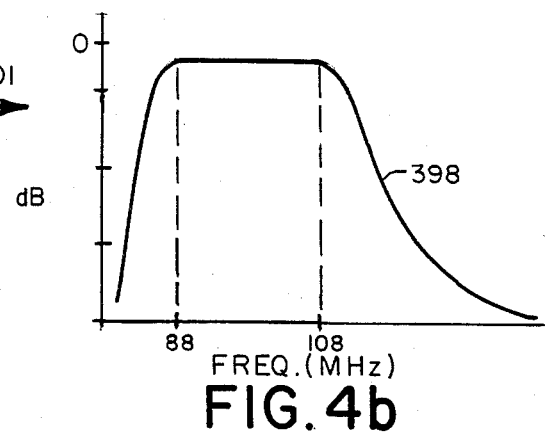
FIG. 4B represents the response curve of the circuit illustrated at FIG. 4A.

FIG. 4A illustrates a preferred embodiment of the FM bandpass filter for use, for example, in connection with the preferred embodiment described in connection with FIG. 3. This filter is designed to provide sharp cutoff at frequencies below 88 MHz, in order to prevent strong signals from television transmitters operating on VHF Channel 2-6 (54-88 MHz) from causing spurious operation of the control circuitry previously described, and to prevent such signals, particularly the Channel 6 audio carrier at 87.75 MHz, from distorting the FM reception of the automobile radio. In order to provide this sharp rolloff, the preferred embodiment incorporates a four pole, Chebychev bandpass filter as shown. The output characteristic 398 is illustrated in FIG. 4B.

Figures 5A, 5B:
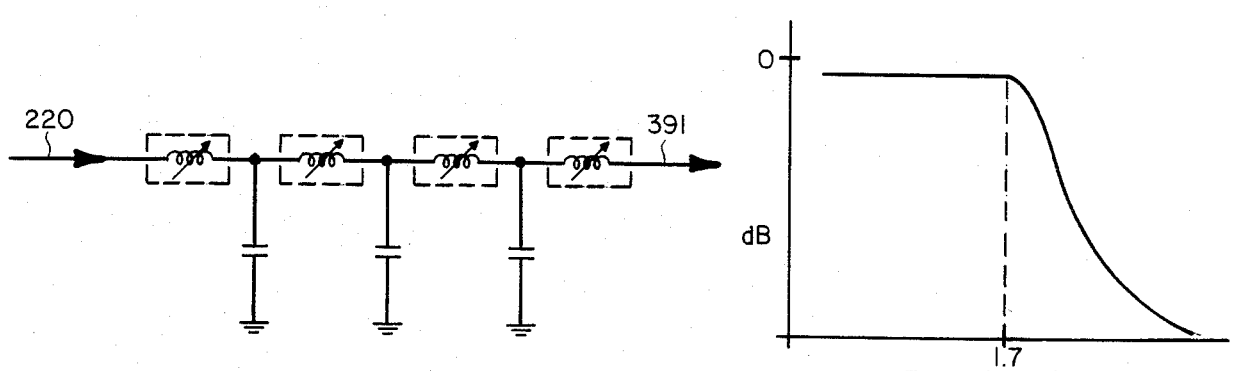
FIG. 5A is a circuit diagram of one embodiment of the AM lowpass filter.
FIG. 5B represents the response curve of the circuit illustrated at FIG. 5A.

The desired AM lowpass filtering described in connection with FIG. 3 is provided by lowpass filter 390 shown in FIG. 5a, and comprises, a three pole Chebychev lowpass filter designed for rolloff at 1.7 MHz. Input and output impedances are optimally set at 75 Ohms. A typical response curve 399 is shown in FIG. 5B.

It should be noted that bandpass filter 300 and lowpass filter 390 as previously described operate in conjunction as a diplexer, such that the terminal impedance presented to the automobile antenna is optimum only within the FM and AM frequency bands.

Figure 6:
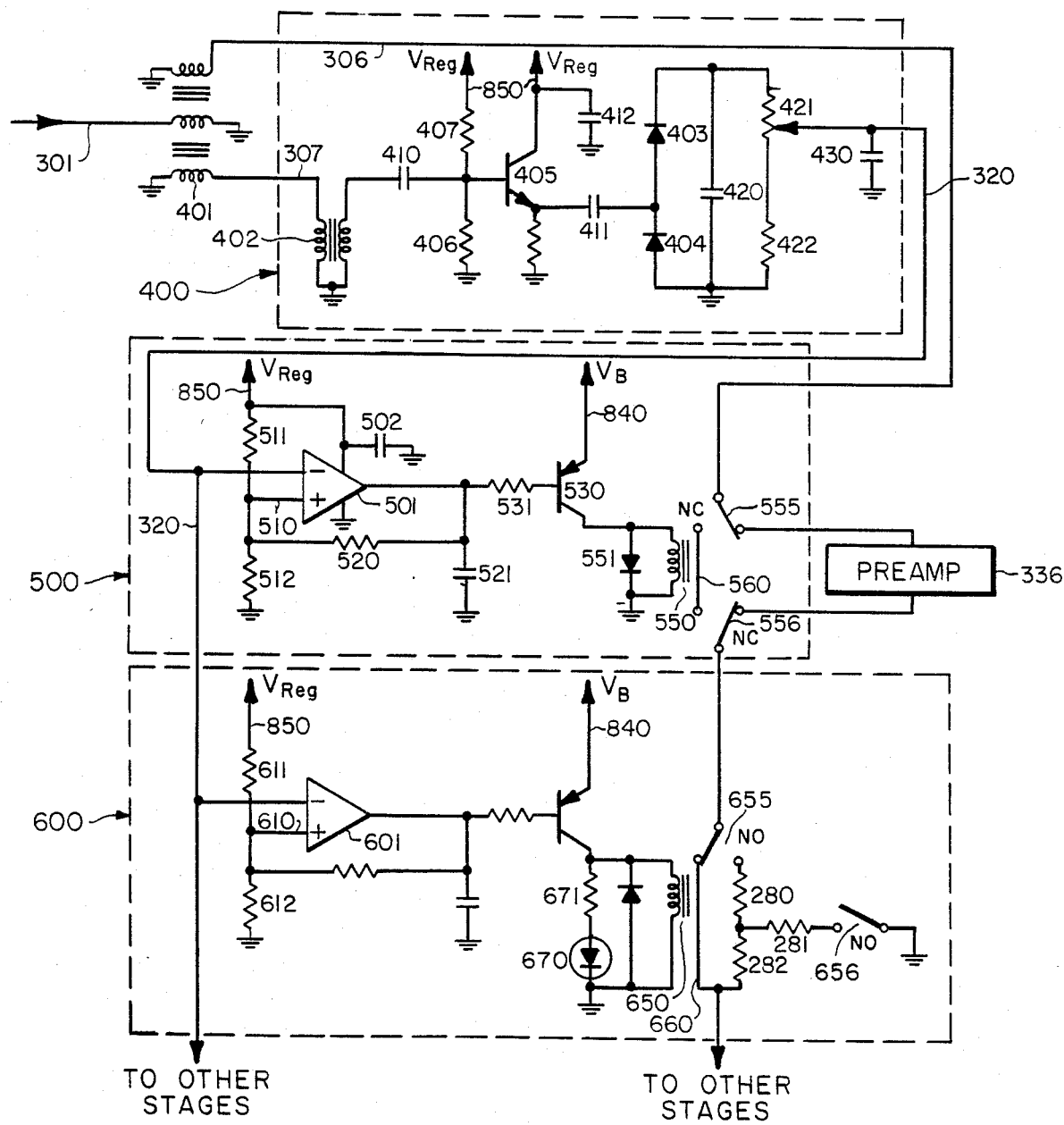
FIG. 6 is a circuit diagram of a preferred embodiment of the FM detector stage, the preamplifier control and switching stages, and a typical attenuator control and switching stage.

FIG. 6 illustrates the preferred embodiment of the detector stage 400, the preamplifier control and switching stage 500, and a representative attenuator and attenuator control and switching stage 600.

FM band limited signal 301 is applied to splitter 401, resulting in previously described FM signals 306 and 307. Signal 307 is applied to the FM detector 400 to generate DC control voltage 320.

In order to provide optimum operation, detector 400 must ideally be sufficiently sensitive to provide appropriate control for preamplifier 336, yet have adequate dynamic range to prevent strong signal overloading and the resulting distortion and failure of operation.

In a preferred embodiment, sensitivity is enhanced by providing broadband RF transformer 402 to increase the voltage of the received RF signal. Because the impedance of the transformer in operation is greater than the detector diodes 403,404, impedance matching transistor 405 is provided. Transistor 405 is biased by resistors 406 and 407 to provide sufficient linear dynamic range to prevent distortion for strong input signals. Blocking capacitors 410 and 411 prevent any DC components from affecting the detector diodes, while capacitor 412 operates as an RF collector bypass such that transistor 405 operates in the common collector mode with respect to the RF frequencies of interest.

Rectification is provided by detector diodes 403 and 404, which in the preferred embodiment may be hot carrier, Schottky barrier diodes. The resulting DC signal is smoothed by capacitor 420, and provided to a voltage divider comprising variable resistor 421 and resistor 422.

The voltage divider described is provided in the preferred embodiment to permit selection of the relative amplitude of control signal 320. This allows the operation of the control circuitry, described more fully in the following, to be adjusted to correspond to radio receivers having greater or lesser amounts of input sensitivity. It shall be seen that by appropriate adjustment of variable resistor 421, the relative voltage level of control signal 320 may be selected to be a greater or lesser percentage of the total rectified voltage appearing across capacitor 420. It should be understood, however, that the control voltage may alternatively be taken without use of a voltage divider, with use of a fixed voltage divider, or with use of a voltage divider having discrete selectable parameters.

Finally, capacitor 430 is provided to shunt any remaining RF from control signal 320.

FIG. 6 further illustrates the preferred embodiment of preamplification control and switching circuitry 500. The control voltage 320 is applied to the inverting input of comparator 501, which may be any standard integrated comparator, preferably designed for operation with a single 12-16 volt DC supply. Capacitor 502 is preferably connected to the power supply input of the comparators to filter any residual RF or transients in the DC comparator power supply described in connection with FIG. 8.

The threshold voltage 510 applied to the noninverting input of comparator 501 is derived from a resistor voltage divider comprising resistors 511 and 512. By appropriate selection of the respective values of resistors 511,512, threshold voltage 510 may be selected to be any desired voltage.

Hysteresis is provided in the operation of comparator 501 by means of feedback resistor 520 between the output of comparator 501 and its noninverting input. The value of hysteresis is selected to prevent undesirable oscillation due to noise impressed on the control signals, and to provide smooth and overlapping operation of the switching circuitry, as described more fully in connection with FIG. 9. In the preferred embodiment, capacitor 521 is further provided between the output of comparator 501 and the vehicle ground in to provide a rolloff in operation of the comparator at approximately 5 Hz. In this manner, comparator 501 has sufficient response speed, while spurious operation due to oscillation or residual AM on the control signals is eliminated.

The output of comparator 501 is supplied to switching transistor 530 by current limiting resistor 531. Transistor 530 is operated as an electronic switch between its cutoff and saturated states, with the emitter of the PNP transistor connected to the filtered battery supply voltage, Vb (840, described more fully in connection with FIG. 8), and with the collector connected to the coil of switching relay(s) 550. The second end of the relay coil(s) is connected to vehicle ground. Protection diode 551 is provided to prevent negative transients from damaging transistor 531 or comparator 501.

It should be noted that, although the preferred embodiment is shown as utilizing a single DPDT switching relay, alternative electrical or electronic switching configurations are possible. For example, a plurality of individual relays may alternatively be employed, with the respective coils connected in parallel to provide for simultaneous operation.

Figure 7:
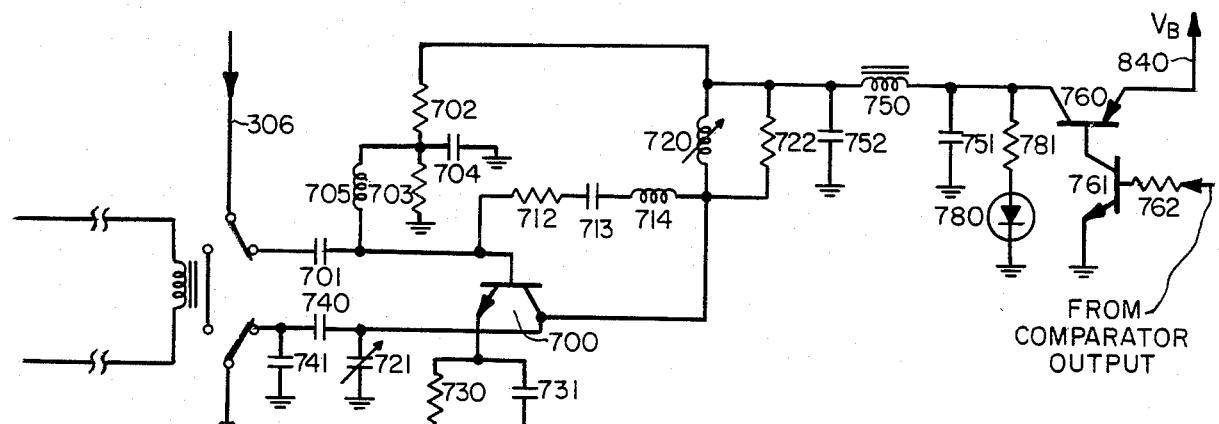
FIG. 7 is a circuit diagram of a preferred embodiment of the preamplifier.

The comparator output is also provided to the power switching circuitry of the preamplifer 336, as described more fully in connection with FIG. 7.

It shall be seen that when the detector control voltage 320 is less than the threshold voltage 510, corresponding to an input signal strength that requires preamplification, the output of comparator 501 will be at a "high" state, approximately equal to the supply voltage, Vreg. Because the supply voltage is approximately equal to the filtered battery voltage 840, transistor 530 is in the cutoff region of operation, and no current is conducted through the coil of relay(s) 550.

The contacts of relay(s) 550 are shown as normally closed contacts. Therefore, for the circumstances previously described, the input signal 306 is applied to preamplifier 336 by contacts 555, while the amplified output is supplied to the remaining signal processing elements by contacts 556.

In a similar fashion, for control signal 320 greater than the threshold 510, the output of comparator 501 is "low," causing transistor 530 to operate in the saturation region with the collector current energizing the coil of relay(s) 550. Under these circumstances, contacts 555 and 556 are in the alternate positions such that preamplifier 336 is removed from the signal path, and replaced by bypass conductor 560, which conducts the input signal 306 directly to the next successive processor stage in substantially unaltered form.

It should be noted that equivalent configurations including, for example, reversal of the inputs to comparator 501, and/or use of alternative electronic and/or relay switching configurations, are possible.

FIG. 6 further illustrates a representative attenuator control, switching and attenuation stage 600. As previously discussed, the preferred embodiment includes a plurality of such stages, preferably three, interconnected as depicted in FIG. 3. However, due to the identical nature of each, it is sufficient to describe in detail a single representative stage.

The operation of the attenuator processor stages is in major portion identical to that previously described in connection with the preamplifier control and switching system. Specifically, the detector control voltage 320 and a selected threshold voltage 610 selected by the voltage divider comprising 611 and 612, are applied to the noninverting and inverting inputs, respectively, of comparator 601. The coil of attenuator relay(s) 650 is therefore activated when the control voltage 320 exceeds the set threshold voltage 610, representing a circumstance when the input signal is undesirably strong and requires attenuation.

In connection with attenuator stage 600, a visual status indicator is shown which corresponds to one of the indicators 115 depicted in FIG. 1. Specifically, light emitting diode 670 in series with current limiting resistor 671 is connected in parallel to the coil of relay(s) 650. In this manner, when the coil is energized, corresponding to insertion of the attenuator, a visible output signal is generated to inform the user that signal processing by attenuation is occurring.

As with the preamplifier stage, the preferred embodiment utilizes switching relay(s) as shown to provide for insertion or bypassing of the attenuator itself. Attenuation is provided by a simple "T" configuration resistive attenuator comprising resistors 280, 281 and 282, although alternative passive or active RF attenuators may alternatively be utilized. When attenuation is desired, contacts 655 and 656 are in the alternate position, such that the signal is made to pass through the voltage dividing attenuator. When no attenuation is desired, the signal is routed through the bypass conductor 660. In addition, the attenuator is disconnected from ground by means of SPST contacts 656 to prevent undesired shunting of the RF signal to ground by means of resistors 281, 282. Alternative switching configurations are possible.

In the control circuits described, relays have been used to perform the switching function. This has been found to be desirable due to their superior performance at the high signal strengths present in worst-case environments. In addition, although electronic switching circuits are known, such as those utilizing PIN diodes, such circuits typically exhibit nonlinear characteristics at high power levels, which can introduce undesirable intermodulation distortion to the processed signal. Further, switching circuits utilizing such diodes require a multiplicity of diodes, and are accordingly complex and expensive.

The relays utilized may be of standard design, preferably for operation at 12 volts DC with minimum current drain. However, it is preferable that the switching time be minimized to prevent distortion caused by momentary removal of an input to the radio receiver, which may result in undesired operation of the receiver's automatic gain control maximizing gain of the IF amplifier in an attempt to compensate. It has been found that switching times on the order of 6 milliseconds provide adequate operation, since the normal delays designed into typical AGC circuitry are sufficient to prevent undesired extraneous operation of the receiver.

It should be understood in association with the foregoing description of the preferred embodiment that alternative configurations are possible. For example, splitter 401 may be designed to provide the combined splitting and voltage boosting function of splitter 401 and transformers 402. Alternative embodiments for the FM detector, for the control comparators, and for the specific switching circuitry described are also possible.

FIG. 7 illustrates a preferred embodiment for the FM preamplifier. The input signal 306 is supplied to the base of transistor 700 through blocking capacitor 701. Bias is determined by the voltage divider comprising resistors 702 and 703, as filtered by capacitor 704. This bias voltage is supplied to the base of transistor 700 through RF isolation inductor 705.

Because of the decreasing gain of transistor 700 with increasing input frequency, a series feedback circuit comprising resistor 712, capacitor 713, and inductor 714 is utilized. The resulting tuned feedback decreases with increasing frequency, compensating for the aforementioned decrease in gain and flattening the RF frequency response of transistor 700.

Collector tuning is provided by inductor 720 and capacitor 721. The quality factor of the resulting tuned circuit is set by resistor 722.

Emitter resistor 730 is paralleled by capacitor 731, which presents a low impedance ground for RF signals present.

Finally, capacitors 740 and 741 provide capacitive impedance transformation to the desired 75 Ohm output impedance.

Power to the preamplifier described is supplied through choke 750, which operates in conjunction with capacitors 751 and 752 to block and remove undesired transients and RF on the battery supply voltage. Current is selectively supplied by the electronic switching circuit comprising transistor 760 and 761, which receives as its input the control output of comparator 501 through current limiting resistor 762. Thus, the preamplifier is energized only when amplification is required.

Finally, an optical indicator corresponding to indicator 114 of FIG. 1 is provided, comprising light emitting diode 780 and current limiting resistor 781.

It should be understood that, although the foregoing details one preferred embodiment, other configurations are possible. For example, other forms of RF preamplification may be utilized. Further, although electronic power switching is shown, other methods of controllable switching may similarly be utilized, or the circuit may be left continuously on.

Figure 8:
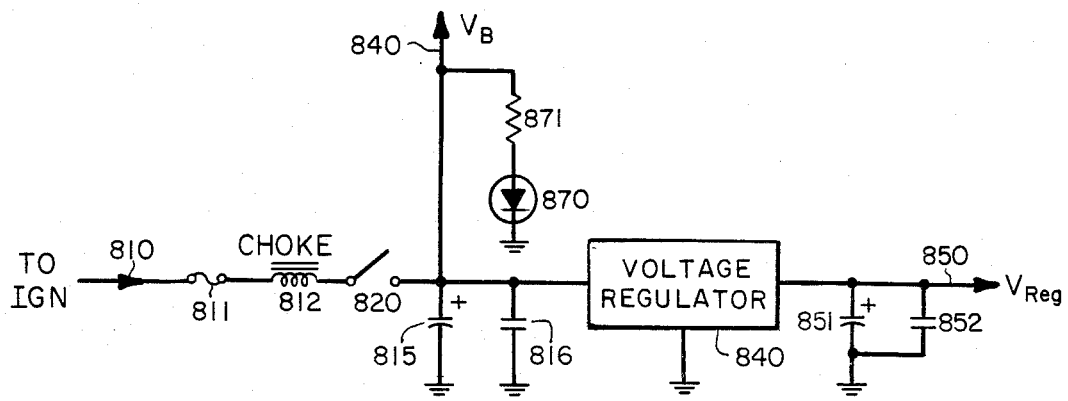
FIG. 8 is a circuit diagram of the preferred embodiment of the power supply and filter.

FIG. 8 illustrates a preferred embodiment for the power supply of the foregoing circuitry. Input 810 is attached to the automobile electrical system, preferably to the switched ignition circuit. Alternatively the power supply input 810 may be attached to other switched or unswitched power sources, such as the switched power antenna control lead of an automatic antenna system. Protection from excessive currents due to short circuits or other malfunctions is provided by fuse 811.

Choke 812 is provided in conjunction with capacitors 815 and 816 to block and filter undesired transients and alternating signals, including RF, from the supply. The resulting filtered battery voltage 840 (Vb) is supplied to the appropriate portions of the circuit as previously indicated.

Switch 820 is optionally provided to permit the user to activate or deactivate the interface circuitry. When deactivated, the input signal is band pass limited in the FM range, and thereafter passed substantially unaltered through the signal processor to the output. With the exception of the nominal insertion loss of the circuit described, typically 0.5 dB, the output signal is thus substantially identical to the input signal. When, however, the circuitry is activated, the full benefit of the automatic signal processing interface is present. In this manner, the switch permits the user to compare the processed and unprocessed signals, and thereby note the dramatic improvement present.

Because automotive electrical systems are subject to variations in voltage levels, threshold voltages derived simply from the battery supply voltage are subject to undesirable fluctuations in absolute level. Therefore, the preferred embodiment includes voltage regulator 840, which produces a stable output 850 (Vreg), preferably at 10 volts DC. Capacitors 851 and 852 provides additional filtering of the regulated output voltage 850, which is also supplied to the comparators to assure their stable operation and to prevent possible excessive battery voltages from damaging the components.

Finally, an optical On/Off status indicator, corresponding to indicator 113 of FIG. 1, is shown comprising light emitting diode 870 and current limiting resistor 871.

Figure 9:
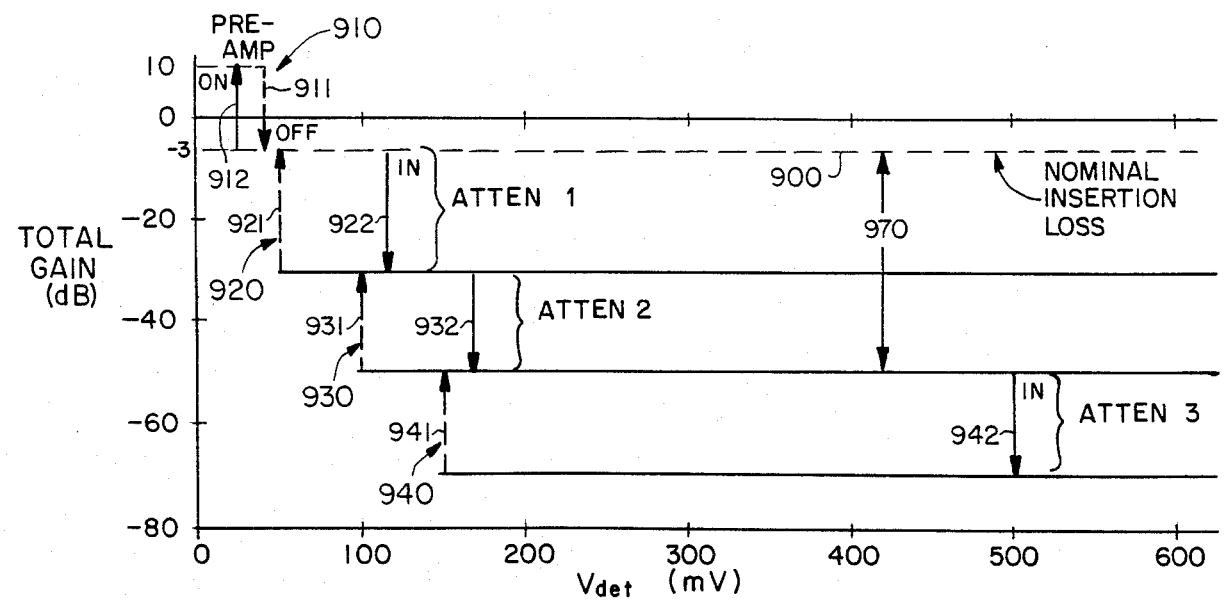
FIG. 9 is a diagram illustrating graphically the response characteristics of the preferred embodiment, including hysteresis.

FIG. 9 depicts graphically the operation of the preferred embodiment of the signal optimizing interface described above. Specifically, the total gain of the interface, representative of the amplification or attenuation of the input FM signal, is depicted relative to a representative scale illustrating increasing values of the control voltage.

A base line of 0 dB is shown. However, the preferred embodiment exhibits a nominal insertion loss of approximately 0.5 dB resulting from the FM bandpass filter, the splitter, and the relay contact/bypass series configuration. This is depicted as nominal operating level 900.

Curve 910 depicts the operation of the preamplifier, including the preferred hysteresis of the control comparator. Specifically, for control voltages less than threshold 911, the preamplifier is engaged to provide the desired gain as shown. As signal strength increases and the resulting control voltage similarly increases, the preamplifier is turned off at threshold 911 and remains off for all greater voltages. However, the preamplifer is not re-energized when the voltage drops to threshold 911, but only when the lesser threshold 912 is reached. At this point the preamplifier will be turned on, and will remain on for all lesser voltages, and until the voltage again exceeds threshold 911.

Curves 920, 930 and 940 represent the respective responses of the three individual stages of attenuation in the preferred embodiment, including a diagrammatic representation of the preferred hysteresis characteristics. It should be noted that the hysteresis loops of the individual attenuators are preferably designed to overlap as shown, such that for both increasing and decreasing signals above the initial thresholds for requiring some form of attenuation, the higher order attenuators follow the lower order stages in turn on, and preceed them in turn off. This results in a smooth transition between the individual stages of attenuation and avoids introduction of undesirable noise or interference as the radio receiver AGC compensates for the changing input strengths that result.

The operation of the present invention may be best understood by analyzing FIG. 9 in conjunction with first an increasing, and then a decreasing signal.

For a given input signal which is initially weak, the control voltage will be below the preamplifier threshold, and the preamplifier will be engaged. As the signal strength increases, and the control voltage correspondingly increases, the preamplifier is removed at threshold 911. This threshold is selected to be at a point where the received signal is sufficient to provide optimum performance of a standard radio receiver, without additional amplification.

For all received signal strengths between threshold 911 and threshold 922, therefore, the received signal is passed substantially unaltered to the receiver, subject only to the nominal insertion loss of the interface. This range represents the optimum input dynamic range of a normal car receiver apparatus.

At threshold 922, the received signal strength is sufficiently strong to result in possible overloading and intermodulation distortion in the standard radio. Accordingly, a first stage of attenuation chosen to prevent such overloading, yet chosen to retain the processed signal at a sufficient strength to be within the receiver's optimum dynamic range, is activated.

As the signal increases still further, a threshold 932 is reached at which yet further attention is desirable. At this point the second stage of attenuation in the preferred embodiment is activated concurrent with the previously activated first stage of attenuation. The resulting total attenuation 970 is therefore presented to the bandpass limited signal.

Finally, the third and final stage of attenuation is activated at threshold 942 to prevent overloading of the receiver input due to very high level signals.

As the signal strength decreases, the sequence of events is substantially reversed. However, the third stage of attenuation is retained until turn off threshold 941, which is displaced below the turn on threshold 942 by an amount equal to the hysteresis of the third comparator. At threshold 941, the third stage of attenuation is removed, while stages one and two are retained. When the signal falls still further to threshold 931, the second attenuator is removed, while at threshold 921 no attenuation is required and the first stage is also removed. Finally, when the signal falls to threshold 912, amplification is once again required and the preamplifier is activated.

Table 1 sets forth below the specific threshold voltages and gain characteristics for each of the signal processing stages described in connection with the preferred embodiment. It should be noted that variations between successive levels of attenuation, both in connection with the individual attenuator gains and the corresponding threshold voltages, have been selected to provide optimum operations in light of the nonlinear relationships existing in connection with the signal strengths of received FM signals and the desired signal processing to be performed thereon. However, it is understood that other modes of operation are possible.

The foregoing description and drawings merely explain and illustrate the invention; the invention is not limited thereto, except insofar as the appended claims are so limited, for those skilled in the art who have the disclosure before them will be able to make modifications and variations therein without departing from the spirit and scope of the present invention.

TABLE I

|  | NOMINAL VALUE |
| --- | --- |
| FM Band Insertion Loss/Gain | (dB) |
| Pre-amplifier ON | 10.0 |
| Pre-amplifier OFF | −0.5 |
| First attenuator IN | −30.0 |
| Second attenuator IN | −50.0 |
| Third attenuator IN | −70.0 |
| FM Band Single Signal (98 MHz) Amplitude Trip Points (Increasing Level) | (mV) |
| Pre-amplifier OFF | 40.0 |
| First attenuator IN | 130.0 |
| Second attenuator IN | 175.0 |
| Third attenuator IN | 500.0 |
| FM Band Single Signal (98 MHz) | |

TABLE I-continued

| Amplitude Trip Points (Decreasing Level) | NOMINAL VALUE (mV) |
| --- | --- |
| Pre-amplifer ON | 58.0 |
| First attenuator OUT | 70.0 |
| Second attenuator OUT | 95.0 |
| Third attenuator OUT | 150.0 |

I claim:

1. An automatic signal processing interface for interfacing the antenna of an automobile or other vehicle to the vehicle's FM radio receiver apparatus, said interface comprising:
   means for suppressing signals of undesired frequency outside of the FM broadcast band, resulting in an FM band signal comprising substantially all signals within the FM broadcast band and no others;
   controllable amplifier means for amplifying said FM band signal when desired, said means functionally coupled to said suppressing means;
   controllable variable attenuator means for attenuating said FM band signal when desired, said means functionally coupled to said suppressing means;
   said controllable variable attenuator means including a plurality of individual selectable attenuators; and
   means for controlling said controllable amplifier means and said controllable variable attenuator means responsive to the overall signal strength of said FM band signal, said controlling means functionally coupled to said suppressing means,
   one or more of said individual selectable attenuators being individually or collectively inserted into or removed from the signal path of said FM band signal under the control of said controlling means, such that said FM band signal is amplified by said controllable amplifier means when said FM signal is below a first general threshold level, and is attenuated by said inserted individual selectable attenuators when said FM signal is above a second general threshold level.

2. The automatic signal processing interface of claim 1, wherein said individual selectable attenuators are in a series connection, such that the total instantaneous attenuation provided by said controllable variable attenuator means is substantially equal to the sum of the individual attenuations gains in decibels of those of said individual selectable attenuators which are selectively inserted into the signal path of said FM band signal at a given time.

3. The automatic signal processing interface of claim 1, wherein said controlling means comprises:
   FM level detector means, said level detector means generating a control signal voltage substantially proportional to the overall signal strength of said FM band signal;
   threshold voltage means, said threshold voltage means generating threshold voltages corresponding to the levels of said control signal voltage which further correspond to those levels of said FM band signal at which controlled operation of said controllable amplifier means or said controllable attenuator means is optimally desired; and
   comparator means, said comparator means comparing said threshold voltages to said control signal voltage for selectively inserting or removing said controllable amplifier means or said controllable variable attenuator means into or out of said signal path, respectively.

4. The automatic signal processing interface of claim 3, further comprising electrically operable switching means,
   a first of said switching means associated with said controllable amplifier means;
   additional switching means individually associated with said individual selectable attenuators;
   said electrically operable switching means operatively inserting said associated amplifier means, or said associated individual attenuator means, into said signal path of said FM band signal in response to a first control input, and operatively removing said associated amplifier means or said associated individual attenuator means from said signal path in response to a second control input;
   said control inputs being derived from the outputs of said comparator means.

5. The automatic signal processing interface of claim 3, wherein said comparator means includes hysteresis.

6. The automatic signal processing interface of claim 1, wherein said interface further includes AM signal circuitry,
   said AM signal circuitry accepting AM broadcast frequency band signals from the input signal received by said antenna;
   said AM signal circuitry providing said AM frequency band signals to said automobile radio receiver to permit said receiver to receive AM broadcast as well, said interface thereby passing said AM band signals to said radio receiver substantially unmodified, while preventing FM band signals from bypassing said controllable amplifier means and said controllable attenuator means.

7. The automatic signal processing interface of claim 3, wherein said FM level detector means comprises:
   RF transformer means, said RF transformer means for elevating the voltage of the input FM band RF signal provided by said suppression means;
   rectifying means for rectifying said elevated voltage signal to produce a DC output voltage substantially proportional to the RF signal level applied to said rectifying means; and
   impedance matching means operatively connecting the output of said RF transformer means to the input of said rectifying means,
   said impedance matching means designed to provide substantially distortion free and linear operation of said FM detector within the entire dynamic range of said input FM band RF signal.

8. An automatic signal processing interface for interfacing the antenna of an automobile or other vehicle to the vehicle's FM radio receiver apparatus, said interface comprising:
   means for suppressing signals of undesired frequency outside of the FM broadcast band, resulting in an FM band signal comprising substantially all signals within the FM broadcast band and no others;
   controllable amplifier means for amplifying said FM band signal when desired, said means functionally coupled to said suppressing means;
   controllable variable attenuator means for attenuating said FM band signal when desired; said means functionally coupled to said suppressing means;
   said controllable amplifier means connected in series with said controllable attenuator means within the signal path of said FM band signal; and means for controlling said controllable amplifier means and said controllable variable attenuator means responsive to the overall signal strength of said FM band signal, said controlling means functionally coupled to said suppressing means, said controllable amplifier means and said controllable attenuator means being individually or collectively inserted into or removed from said signal path, under the control of said controlling means, such that said FM band signal is amplified by said controllable amplifier means when said FM signal is below a first general threshold level, and is attenuated by said controllable variable attenuator means when said FM signal is above a second general threshold level.

* * * * *